(12) United States Patent
Seo et al.

(10) Patent No.: US 9,519,531 B2
(45) Date of Patent: Dec. 13, 2016

(54) MEMORY DEVICES AND MEMORY SYSTEMS HAVING THE SAME

(71) Applicant: Samsung Electronics Co., Ltd., Suwon-Si, Gyeonggi-Do (KR)

(72) Inventors: Seong-Young Seo, Hwaseong-si (KR); Chul-Woo Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 500 days.

(21) Appl. No.: 14/054,957

(22) Filed: Oct. 16, 2013

(65) Prior Publication Data

US 2014/0149808 A1 May 29, 2014

Related U.S. Application Data (60) Provisional application No. 61/730,143, filed on Nov. 27, 2012.

(30) Foreign Application Priority Data

Mar. 13, 2013 (KR) ........................ 10-2013-0026769

(51) Int. Cl.
*G06F 11/07* (2006.01)
*G11C 7/10* (2006.01)

(52) U.S. Cl.
CPC ........... *G06F 11/073* (2013.01); *G06F 11/076* (2013.01); *G11C 7/1063* (2013.01); *G11C 7/1006* (2013.01)

(58) Field of Classification Search
CPC .. G06F 11/1048; G06F 11/073; G06F 11/0793
See application file for complete search history.

(56) References Cited

U.S. PATENT DOCUMENTS

| | | | | |
|---|---|---|---|---|
| 4,030,091 A | * | 6/1977 | Ngo | G06F 3/0386 345/209 |
| 6,023,775 A | * | 2/2000 | Fujii | G06F 11/2268 714/48 |
| 6,130,847 A | * | 10/2000 | Huang | G11C 7/22 365/194 |
| 6,295,593 B1 | | 9/2001 | Hsu et al. | |
| 6,434,082 B1 | * | 8/2002 | Hovis | G11C 7/1045 365/203 |
| 7,099,215 B1 | | 8/2006 | Rotenberg et al. | |
| 7,877,361 B2 | * | 1/2011 | Yamamoto | G06F 11/1469 707/648 |
| 9,355,721 B2 | * | 5/2016 | Yoon | G11C 13/0069 |
| 2004/0156251 A1 | * | 8/2004 | Shiota | G11C 16/349 365/200 |

(Continued)

*Primary Examiner* — Loan L. T. Truong
(74) *Attorney, Agent, or Firm* — Harness, Dickey & Pierce (57) ABSTRACT

In one example embodiment, a memory device includes a cell array configured to receive data at an associated address in response to a write command. The memory device further includes a storage unit configured to receive the associated address and the data in response to the write command and output the data to the associated address of the cell array in response to a rewrite command. The memory device further includes a violation determining unit configured to determine violation data, count a number of the violation data and determine data written to the storage unit as the violation data if a storage duration of the written data is less than a write recovery time (tWR).

18 Claims, 8 Drawing Sheets

(56) References Cited

U.S. PATENT DOCUMENTS

| | | | | |
|---|---|---|---|---|
| 2005/0117437 A1* | 6/2005 | Lee | G11C 7/1078 | 365/230.05 |
| 2006/0271756 A1* | 11/2006 | Pyo | G11C 11/406 | 711/167 |
| 2007/0097780 A1* | 5/2007 | Chen | G11C 11/419 | 365/49.17 |
| 2007/0174678 A1* | 7/2007 | King | G06F 11/1435 | 714/6.13 |
| 2007/0183251 A1* | 8/2007 | Jang | G11C 5/14 | 365/233.1 |
| 2008/0189588 A1* | 8/2008 | Tanaka | G06F 11/1068 | 714/764 |
| 2008/0250185 A1* | 10/2008 | Clark | G06F 1/04 | 710/306 |
| 2010/0023840 A1* | 1/2010 | Nakao | G06F 11/1008 | 714/763 |
| 2010/0088485 A1* | 4/2010 | Ikeda | G06F 3/0608 | 711/170 |
| 2010/0202231 A1* | 8/2010 | Boeve | G11C 7/04 | 365/210.1 |
| 2010/0220526 A1* | 9/2010 | Choi | G11C 11/5628 | 365/185.03 |
| 2011/0099460 A1* | 4/2011 | Dusija | G11C 11/5621 | 714/773 |
| 2011/0110172 A1 | 5/2011 | Lee et al. | | |
| 2011/0267016 A1* | 11/2011 | Kajiyama | H02M 3/157 | 323/271 |
| 2012/0008426 A1 | 1/2012 | Demone | | |
| 2012/0047297 A1 | 2/2012 | Bulgin et al. | | |
| 2012/0072806 A1* | 3/2012 | Tabata | G06F 11/1048 | 714/773 |
| 2012/0079353 A1* | 3/2012 | Liikanen | G06F 11/1048 | 714/773 |
| 2013/0033929 A1* | 2/2013 | Kim | G11C 13/0004 | 365/163 |
| 2013/0080826 A1* | 3/2013 | Kondo | G11C 7/1006 | 714/6.2 |
| 2013/0166949 A1* | 6/2013 | Um | G06F 11/073 | 714/15 |
| 2014/0043922 A1* | 2/2014 | Chen | G11C 11/4076 | 365/189.16 |

* cited by examiner

MEMORY DEVICES AND MEMORY SYSTEMS HAVING THE SAME

PRIORITY STATEMENT

This US non-provisional application claims the benefit of priority under 35 USC §119(e) to U.S. Provisional Application No. 61/730,143 filed on Nov. 27, 2012 in the USPTO, and under 35 U.S.C. §119(a) to Korean Patent Application No. 10-2013-0026769 filed on Mar. 13, 2013 in the Korean Intellectual Property Office (KIPO), the contents of each of which are hereby incorporated by reference in their entirety.

BACKGROUND

1. Technical Field

Example embodiments of the inventive concepts relate to memories. More particularly, example embodiments of the inventive concepts relate to memory devices and/or memory systems.

2. Description of the Related Art

A process of manufacturing a memory device such as a dynamic random access memory ("DRAM") has been scaling down. Accordingly, it has been difficult to satisfy a desirable write recovery time tWR of the DRAM.

As the scaling down of the DRAM continues, a contact resistance between a storage capacitor in a DRAM cell and an access transistor increases and an on-current of the access transistor decreases. Thus, a total resistance from a bit line to the storage cell increases so that charging (e.g., writing) data to the storage cell during the given write recovery time tWR, becomes more difficult.

In addition, a storage capacitance decreases compared to a bit line capacitance so that a level of a charge sharing voltage may decrease and a sensing margin may also decrease. Thus, the number of failures of a memory cell may increase due to the write recovery time tWR, which in turn decreases a reliability of the memory device.

SUMMARY

Some example embodiments of the inventive concepts provide a memory device maintaining a desirable write recovery time and improving a reliability of the memory device. Some example embodiments of the inventive concepts also provide a memory system having the memory cell.

In one example embodiment, a memory device includes a cell array configured to receive data at an associated address in response to a write command. The memory device further includes a storage unit configured to receive the associated address and the data in response to the write command and output the data to the associated address of the cell array in response to a rewrite command. The memory device further includes a violation determining unit configured to determine violation data, count a number of the violation data and determine data written to the storage unit as the violation data if a storage duration of the written data is less than a write recovery time (tWR).

In an exemplary embodiment, the violation determining is configured to output an alert signal when the number of the violation data is at least equal to a threshold value and greater than the threshold value.

In yet another example embodiment, the threshold value may be equal to a size of the storage unit.

In yet another example embodiment, the storage unit is configured to rewrite all of the violation data to the cell array.

In yet another example embodiment, the storage unit is configured to rewrite some of the violation data to the cell array.

In yet another example embodiment, when an address of a read command corresponds to the violation data, the storage unit is configured to output the data stored at the storage unit and. When the address of the read command does not correspond to the violation data, the cell array is configured to output the data stored at the cell array.

In yet another example embodiment, a size of the storage unit is less than a size of the cell array.

In yet another example embodiment, the size of the storage unit is determined as a maximum integer less than a value generated by dividing the write recovery time (tWR) of the cell array by a minimum cycle of the write command.

In yet another example embodiment, a data writing speed of the storage unit is faster than a data writing speed of the cell array.

In one example embodiment, a memory system includes a memory device including a cell array configured to receive data at an associated address in response to a write command. The memory device further includes a storage unit configured to receive the associated address and the data in response to the write command and output the data to the associated address at the cell array in response to a rewrite command. The memory system further includes a memory controller configured to output the write command and the rewrite command to the memory device and provide the address and the data to the cell array and the storage unit. The memory system further includes a violation determining unit determine violation data, count a number of the violation data and determine data written to the storage unit as the violation data if a storage duration of the written data is less than a write recovery time (tWR).

In yet another example embodiment, the memory device includes the violation determining unit.

In yet another example embodiment, the memory controller includes the violation determining unit.

In yet another example embodiment, when the memory device receives a read command having the address corresponding to the violation data, the memory device outputs the data stored to the storage unit and when the memory device receives the read command having the address not corresponding to the violation data, the memory device outputs the data stored to the cell array.

In one example embodiment, a memory system includes a memory device configured to receive at least one of a write command, a rewrite command and a read command from a controller and output data from at least one of a memory cell and a storage unit based on based on the received command and a violation status of the data, the violation status indicating whether the data is unreliable data.

In yet another example embodiment, wherein the cell array is configured to receive the data and an address at the cell array, in response to the write command and store the data at the address of the cell array.

In yet another example embodiment, wherein the storage unit is configured to receive the data and an address at the cell array and output the data to the address at the cell array in response to the rewrite command.

In yet another example embodiment, the memory system further includes a violation detection unit configured to determine the violation status of the data upon the memory device receiving the read command.

In yet another example embodiment, the violation detection unit is further configured to determine the violation status by comparing a storage duration of data written to the storage unit with a write recovery time of the memory device, and determining the written data as the unreliable data if the storing duration is less than the write recovery time.

In yet another example embodiment, the memory device is further configured to output the data from the storage unit if the violation status of the data indicates that the data is the unreliable data, and output the data from the cell array if the violation status of the data indicates that the data is reliable.

In yet another example embodiment, the violation detection unit is further configured to count a number of the unreliable data and provide an alert to the controller if the number exceeds a threshold, wherein the controller issues the rewrite command upon receiving the alert.

BRIEF DESCRIPTION OF THE DRAWINGS

The above and other features and advantages of the inventive concepts will become more apparent by describing some example embodiments thereof, with reference to the accompanying drawings, in which.

DETAILED DESCRIPTION OF THE EXAMPLE EMBODIMENTS

Example embodiments will be described more fully hereinafter with reference to the accompanying drawings, in which some of the example embodiments are shown. The inventive concepts may, however, be embodied in many different forms and should not be construed as limited to the example embodiments set forth herein. Rather, these example embodiments are provided so that this disclosure will be thorough and complete, and will fully convey the scope of the inventive concepts to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the inventive concepts will be described in detail with reference to the accompanying drawings.

Figure 1:
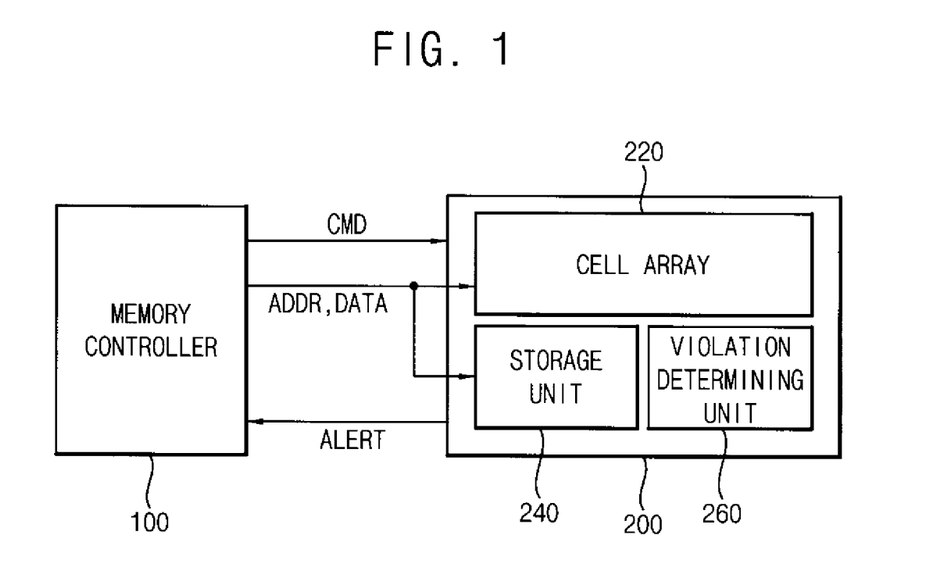
FIG. 1 is a block diagram illustrating a memory system, according to an example embodiment of the inventive concepts.

FIG. 1 is a block diagram illustrating a memory system, according to an example embodiment of the inventive concepts.

Referring to FIG. 1, the memory system includes a memory controller 100 and a memory device 200.

The memory controller 100 controls an operation of the memory device 200. The memory controller 100 generates a command signal CMD and outputs the command signal CMD to the memory device 200. For example, the command signal CMD may include a write command, a read command, a precharge command and a rewrite command.

The memory controller 100 outputs an address ADDR and a data DATA to the memory device 200. The address ADDR represents an address in a cell array 220 where the data DATA is stored. The address ADDR may include any one of, but not limited to, a bank address, a row address and a column address.

In one example embodiment, the memory device 200 may be a dynamic random access memory (DRAM). For example, the DRAM may be one of Double Data Rate (DDR) Synchronous Dynamic Random Access Memory (SDRAM), Low Power Double Data Rate (LPDDR) SDRAM, Graphics Double Data Rate (GDDR) SDRAM, Rambus Dynamic Random Access Memory (RDRAM).

The memory device 200 includes a cell array 220, a storage unit 240 and a violation determining unit 260.

The cell array 220 may include a plurality of word lines extending in a first direction and a plurality of bit lines extending in a second direction crossing the first direction. The cell array 220 may further include a plurality of cells connected to the word lines and the bit lines.

In one example embodiment, each of the plurality of cells includes a switching element connected to the word lines and the bit lines and a storage capacitor connected to the switching element. For example, the switching element may be an access transistor. The word line may be connected to a gate electrode of the access transistor. The bit line may be connected to a source electrode of the access transistor. A drain electrode of the access transistor may be connected to a first electrode of the storage capacitor.

In one example embodiment, the cell array 220 receives the address ADDR and the data DATA from the memory controller 100. The cell array 220 stores the data DATA to the address ADDR. Although not shown in figures, the memory device 200 may further include a bank decoder analyzing a bank address, a row decoder analyzing a row address and a column decoder analyzing a column address. The bank decoder, the row decoder and the column decoder may be disposed adjacent to the cell array 220.

In one example embodiment, the storage unit 240 receives the address ADDR and the data DATA from the memory controller 100. The storage unit 240 stores the address ADDR and the data DATA. For example, the storage unit 240 may be a write buffer.

In one example embodiment, the storage unit 240 stores the address ADDR and the data DATA which violate the write recovery time tWR. During the writing of the data to the memory cell 220, in response to the write command, a precharge command may be inputted. Thus, the data may not be written to the memory cell fast enough so that the word line may be disabled due to the precharge command. In this case, the data may be determined as a violation data, which violates the write recovery time tWR.

When the written data to the storage unit 240 is within the write recovery time tWR of the cell array 220, the violation determining unit 260 determines the data written within the write recovery time tWR, to be labeled as violation data.

The violation determining unit 260 may count the number of the violation data. The violation determining unit 260 may output an alert signal ALERT when the number of the violation data is equal to or greater than a threshold value. The threshold value may be determined, as will be further described below.

A structure and an operation of the memory device 200 will be explained below with reference to FIG. 2.

The memory controller 100 and the memory device 200 may be connected to each other through any one of, but not limited to, a command pin, an address pin and a data pin. The command pins may transmit the command signal CMD through a command transmitting line. The address pins may transmit the address ADDR through an address transmitting line. The data pins may transmit the data DATA through a data transmitting line. The memory controller 100 and the memory device 200 may include an additional pin and an additional transmitting line to transmit the alert signal ALERT.

Figure 2:
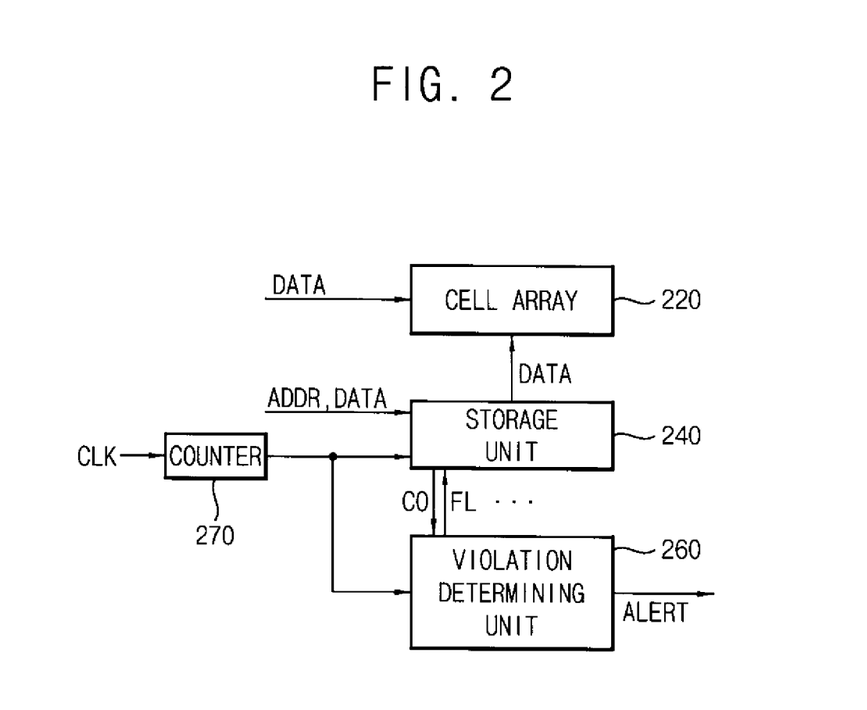
FIG. 2 is a block diagram illustrating a memory device of FIG. 1, according to an example embodiment.

FIG. 2 is a block diagram illustrating the memory device 200 of FIG. 1.

Referring to FIGS. 1 and 2, the memory device 200 includes the cell array 220, the storage unit 240 and the violation determining unit 260. The memory device 200 may further include a counter representing a current time.

The cell array 220 receives the data DATA at the address ADDR from the memory controller 100 in response to the write command. The cell array 220 outputs the data DATA stored at the address ADDR to the memory controller 100 in response to the read command.

In one example embodiment, the storage unit 240 receives the address ADDR and the data DATA from the memory controller 100 in response to the write command. The storage unit 240 may further receive a storing moment CO of the data DATA from a counter 270. The storage unit 240 stores the address ADDR and the data DATA. The storage unit 240 may store the storing moment CO of the data DATA. The storage unit 240 outputs the data DATA to the address ADDR of the cell array 220 in response to the rewrite command. The storage unit 240 may output the storing moment CO of the data DATA to the violation determining unit 260.

The storage unit 240 may output the data DATA corresponding to the address ADDR to the memory controller 100 in response to the read command.

An operation of the storage unit 240 in response to the rewrite command will be explained below with reference to FIGS. 3-4.

An operation of the storage unit 240 in response to the read command will be explained below with reference to FIG. 5.

A size of the storage unit 240 is less than a size of the cell array 220. For example, the size of the storage unit 240 may be determined as a maximum integer less than a value generated by dividing the write recovery time tWR of the cell array 220 by a minimum cycle of the write command.

In one example embodiment, when the write recovery time tWR of the cell array 220 is 50 ns and the minimum cycle of the write command is 6 ns according to a specification of the memory device 200, the value generated by dividing the write recovery time tWR of the cell array 220 by the minimum cycle of the write command is 8.3333 so that the size of the storage unit 240 may be eight. When the write command repetitively occurs in the minimum cycle, the eight data corresponding to the eight adjacent write commands from the current time are violation data which violate the write recovery time tWR. The ninth data corresponding to the ninth write command from the current time is normal data. Thus, the desirable size of the storage unit 240 may be eight in the present example.

In one example embodiment, the size of the storage unit 240 may be less than the value generated by dividing the write recovery time tWR of the cell array 220 by the minimum cycle of the write command. For example, when the write recovery time tWR of the cell array 220 is 50 ns and the minimum cycle of the write command is 6 ns according to a specification of the memory device 200, the size of the storage unit 240 may be set to an integer less than eight because a number of the write commands may not be repetitive in the minimum cycle generally.

In one example embodiment, a data writing speed of the storage unit 240 is faster than a data writing speed of the cell array 220. The data writing speed of the storage unit 240 is faster than the write recovery time tWR of the cell array 220. The data writing speed of the storage unit 240 is faster than the data writing speed of the cell array 220 so that a write latency of the cell array 220 may be compensated by the storage unit 240.

In one example embodiment, the violation determining unit 260 determines that the written data to the storage unit 240 violates the write recovery time tWR.

For example, if a storage duration of the data written to the storage unit 240 is less than the write recovery time tWR, the violation determining unit 260 determines the written data having the storage duration less than the write recovery time tWR, to be the violation data.

If the storage duration of the data written to the storage unit 240 does not exceed the write recovery time tWR, the data DATA is not completely charged to the cell array 220. Thus, the written data having the storage duration less than the write recovery time tWR is determined to be the violation data.

In contrast, if the storage duration of the data written to the storage unit 240 exceeds the write recovery time tWR, the data DATA is completely charged (e.g., written and/or rewritten) to the cell array 220. Thus, the written data having the storage duration equal to or greater than the write recovery time tWR is not the violation data.

For example, when the write recovery time tWR of the cell array 220 is 50 ns and the storage duration of the written data DATA to the storage unit 240 is less than 50 ns, the data DATA is not completely charged to the cell array 220. Therefore, the data is the violation data. In contrast, when the write recovery time tWR of the cell array 220 is 50 ns and the storage duration of the data DATA written to the storage unit 240 is equal to or greater than 50 ns, then the data DATA is completely charged to the cell array 220 so that the data is not the violation data.

The violation determining unit 260 may determine the storage duration using the storage moment CO received from the storage unit and the current time received from the counter 270. The storage moment CO means indicates a moment/time when the data DATA is written to the storage unit 240. In one example embodiment, when the storage moment CO of the data is less than the write recovery time tWR from the current time, the data may be a violation data. In one example embodiment, when the storage moment CO of the data is equal to or greater than the write recovery time tWR from the current time, the data may not be a violation data.

For example, the violation determining unit 260 may determine the violation data in each clock cycle. Alternatively, the violation determining unit 260 may determine the violation data in a plurality of clock cycles. The clock cycle may be known from the clock signal CLK received at the counter 270.

In one example embodiment, the violation determining unit 260 counts the number of the violation data. When the number of the violation data is equal to or greater than a threshold value, the violation determining unit 260 may output the alert signal ALERT to the memory controller 100.

For example, the threshold value may be equal to the size of the storage unit 240. When the storage unit 240 is full, the violation determining unit 260 may output the alert signal ALERT to the memory controller 100.

The violation determining unit 260 may determine whether the data DATA written to the storage unit 240 is the violation data or not, using a flag FL.

For example, the written data which is the violation data may have the flag FL of one. The written data which is not the violation data may have the flag FL of zero.

In one example embodiment, when the storage duration is equal to or greater than the write recovery time tWR, the flag of the written data DATA changes from one to zero. Thus, the flag may be used to determine the violation data.

In one example embodiment, when a new data DATA is inputted to the storage unit 240, the new data is overwritten to a storage area which stores the data having the flag of zero. In contrast, the new data is not overwritten to a storage area which stores the data having the flag of one.

In one example embodiment, when the violation determining unit 260 counts the number of the violation data, the violation determining unit 260 may count the number of the data having the flags of one.

Figure 3:
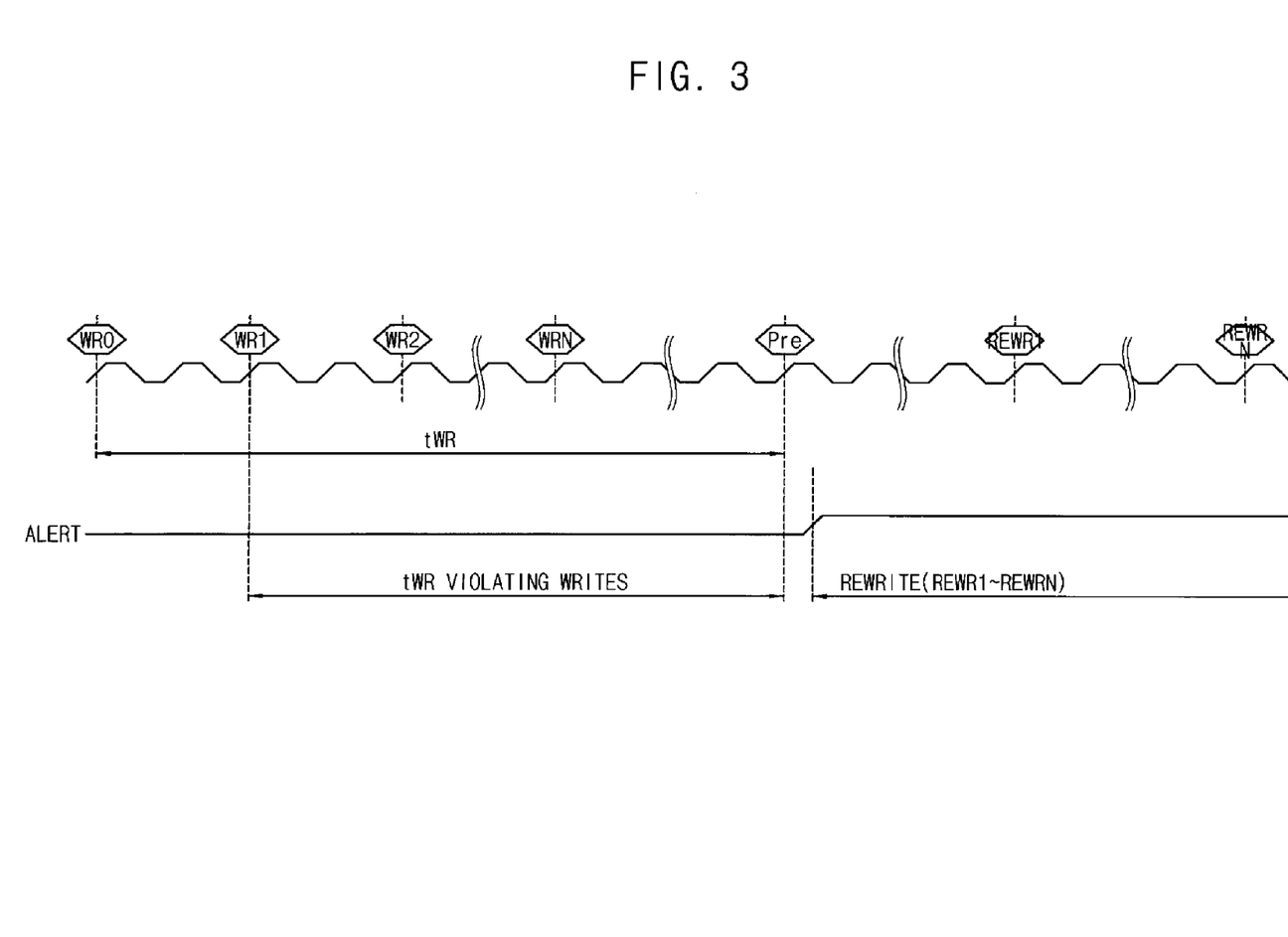
FIG. 3 is a timing diagram illustrating an operation of a violation determining unit of FIG. 2, according to an example embodiment.

FIG. 3 is a timing diagram illustrating an operation of a violation determining unit of FIG. 2, according to an example embodiment.

Referring to FIGS. 1 to 3, an initial write command WR0, a first write command WR1, a second write command WR2, . . . and an N-th write command WRN are continuously inputted from the memory controller 100 to the memory device 200. Then, a precharge command Pre is inputted from the memory controller 100 to the memory device 200.

In one example embodiment, at the moment of the precharge command Pre, the data stored to the storage unit 240 in response to the initial write command WR0 has the storage duration greater than or equal to the write recovery time tWR. Thus, the data stored to the storage unit 240 in response to the initial write command WR0 is not the violation data.

In contrast, at the moment of the precharge command Pre, the data stored to the storage unit 240 in response to the first to N-th write commands WR1 to WRN have the storage durations less than the write recovery time tWR. Thus, the data stored to the storage unit 240 in response to the first to N-th write commands WR1 to WRN are the violation data.

When the threshold value of the violation data is N, the alert signal ALERT is outputted from the memory device 200 to the memory controller 100 at the moment of the precharge command Pre.

The memory controller 100 outputs the rewrite command REWRITE to the memory device 200 in response to the alert signal ALERT.

The storage unit 240 outputs the data DATA stored at the storage unit 240 to the address of the cell array 220 based on the address ADDR stored at the storage unit 240 in response to the rewrite command REWRITE.

In one example embodiment, the storage unit 240 may rewrite all of the violation data to the cell array 220.

For example, the memory controller 100 may output N rewrite commands which is equal to the threshold value N of the violation data to the memory device 200. Accordingly, the storage unit 240 rewrites the data, which are stored to the storage unit 240 by the first to N-th write commands WR1 to WRN, to the cell array 220 in response to the first to N-th rewrite commands REWR1 to REWRN.

Figure 4:
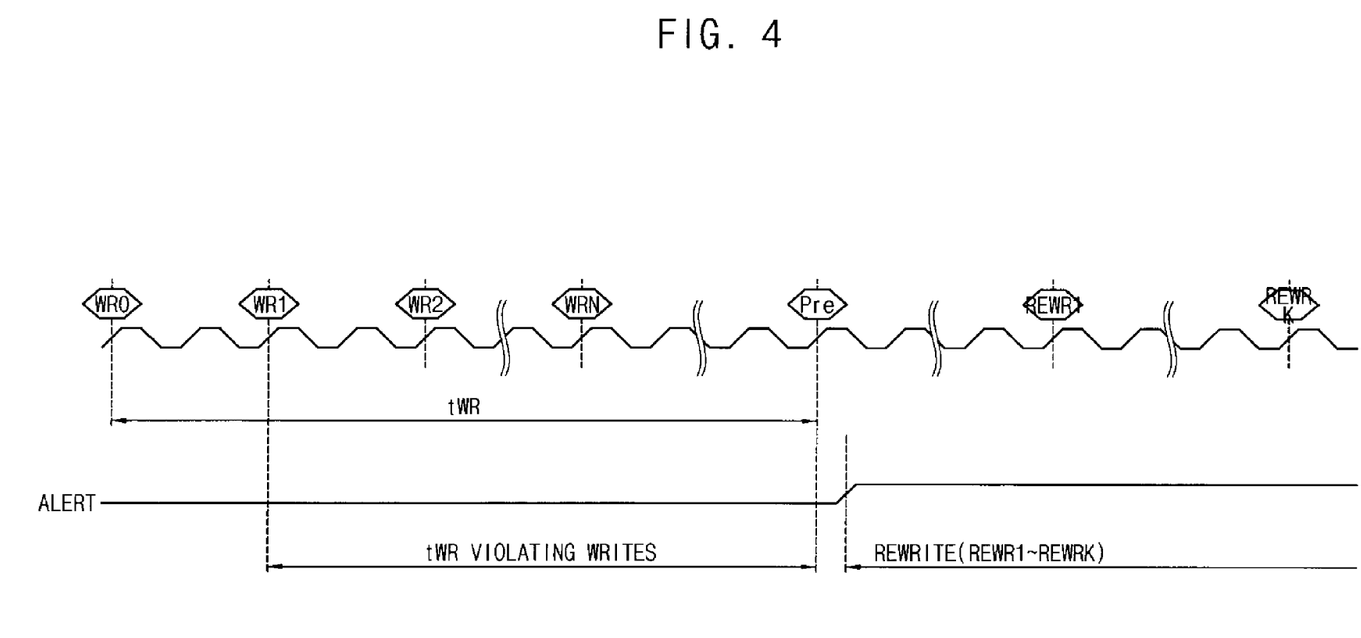
FIG. 4 is a timing diagram illustrating an operation of a violation determining unit, according to an example embodiment of the inventive concepts.

FIG. 4 is a timing diagram illustrating an operation of a violation determining unit, according to an example embodiment of the inventive concepts.

The operation of the violation determining unit according to the example embodiments is substantially the same as the operation of the violation determining unit of the previous exemplary embodiment explained referring to FIG. 3 except that the violation determining unit receives K rewrite commands in response to the alert signal ALERT when the threshold value of the violation data is N. Thus, the same reference numerals will be used to refer to the same or like parts as those described with reference to the example embodiments of FIGS. 1 to 3. Therefore, and any repetitive explanation concerning the same or like parts will be omitted.

Referring to FIGS. 1, 2 and 4, at the moment of the precharge command Pre, the data stored to the storage unit 240 in response to the first to N-th write commands WR1 to WRN have the storage durations, which are less than the write recovery time tWR. Thus, the data stored to the storage unit 240 in response to the first to N-th write commands WR1 to WRN are the violation data.

In one example embodiment, when the threshold value of the violation data is N, the alert signal ALERT is outputted from the memory device 200 to the memory controller 100 at the moment of the precharge command Pre.

The memory controller 100 outputs the rewrite command REWRITE to the memory device 200 in response to the alert signal ALERT.

The storage unit 240 outputs the data DATA stored at the storage unit 240 to the address of the cell array 220 based on the address ADDR stored to the storage unit 240 in response to the rewrite command REWRITE.

In one example embodiment, the storage unit 240 may rewrite some of the violation data to the cell array 220.

For example, the memory controller 100 may output K rewrite commands with K being less than the threshold value N of the violation data to the memory device 200. Accordingly, the storage unit 240 rewrites the data, which are stored at the storage unit 240 by the first to K-th write commands WR1 to WRK, to the cell array 220, in response to the first to K-th rewrite commands REWR1 to REWRK.

Accordingly, a duration of pausing the read and write operations due to the rewrite operation may be decreased so that a performance of the memory device 200 may be improved.

Alternatively, the storage unit 240 may rewrite the data, stored at the storage unit 240 by the K write commands WRN to WR(N−K+1) which are close to the precharge command Pre, to the cell array 220 in response to the first to K-th rewrite commands REWR1 to REWRK.

Figure 5:
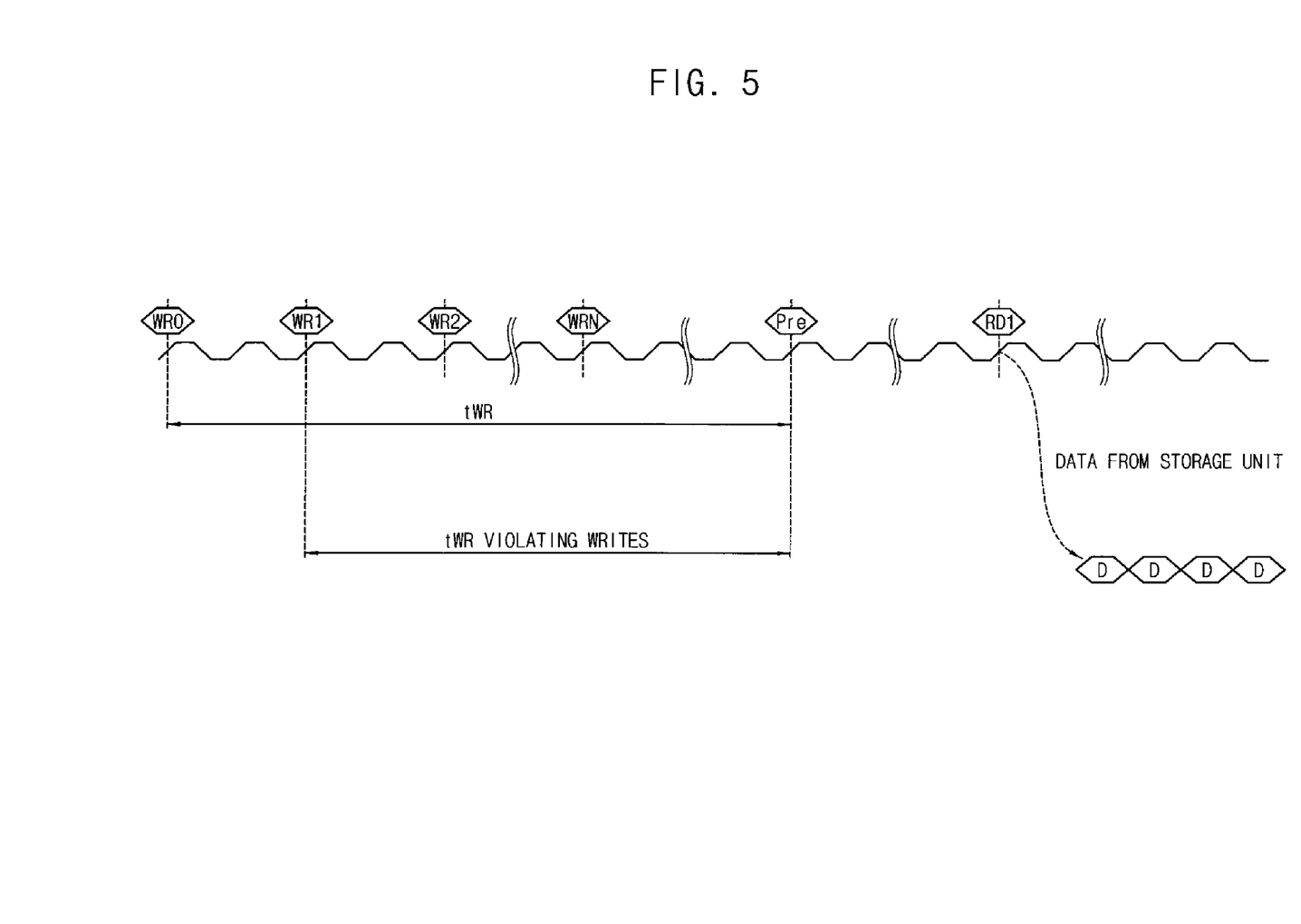
FIG. 5 is a timing diagram illustrating an operation of the memory device of FIG. 1 in response to a read command, according to an example embodiment.

FIG. 5 is a timing diagram illustrating an operation of the memory device 200 of FIG. 1 in response to a read command, according to an example embodiment.

Referring to FIGS. 1 to 3 and 5, when the memory device 200 receives the read command, the memory device 200 determines that the address ADDR of the read command corresponds to the violation data of the storage unit 240.

When the address ADDR of the read command corresponds to the violation data of the storage unit 240, the data stored at the storage unit 240 is outputted to the memory controller 100. In contrast, when the address ADDR of the read command does not correspond to the violation data of the storage unit 240, the data stored to the cell array 220 is outputted to the memory controller 100.

The violation data may represent the data which is not completely charged (e.g., written/rewritten) to the cell array 220. Thus, when the violation data is outputted from the cell array 220, an inadequate data is outputted to the memory controller 100. Therefore, a reliability of the memory device 200 is decreased.

When the read command of the address of the violation data is inputted, the adequate data stored at the storage unit 240, which is an auxiliary storage area having the data writing speed faster than the data writing speed of the cell array 220, is outputted to the memory controller 100. Thus, the reliability of the memory device 200 may be improved.

In FIG. 5, when a first read command RD1 corresponds to the address ADDR of the violation data, the data stored to the storage unit 240 may be outputted to the memory controller 100.

In one example embodiment, the storage unit 240 stores the data violating the write recovery time tWR and the address of the violation data. When the read command of the address of the violation data is inputted, the data is not outputted from the cell array 220 but from the storage unit 240. Thus, even though the cell array 220 of the memory device 200 does not meet the desirable specification of the write recovery time tWR, the memory device 200 may output the adequate data. Therefore, the reliability of the memory device 200 may be improved.

Figure 6:
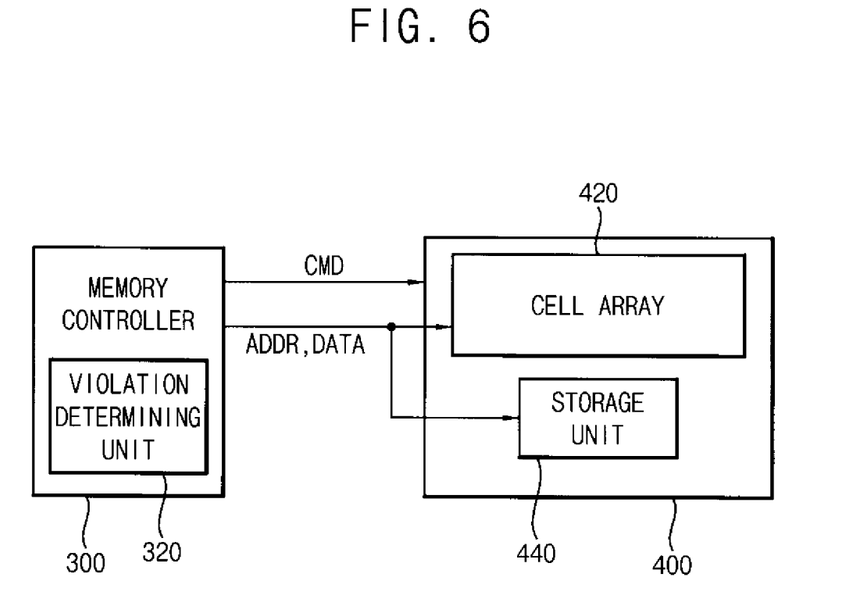
FIG. 6 is a block diagram illustrating a memory system, according to an example embodiment of the inventive concepts.

FIG. 6 is a block diagram illustrating a memory system, according to an example embodiment of the inventive concepts.

The memory system according to the example embodiment of FIG. 6, is substantially the same as the memory systems of the example embodiments described with reference to FIGS. 1 to 5 except that the memory controller includes the violation determining unit. Thus, the same reference numerals will be used to refer to the same or like parts as those described in the previous exemplary embodiment of FIGS. 1 to 5 and any repetitive explanation concerning the above elements will be omitted.

Referring to FIG. 6, the memory system includes a memory controller 300 and a memory device 400.

The memory controller 300 controls an operation of the memory device 400. The memory controller 300 generates a command signal CMD and outputs the command signal CMD to the memory device 400.

The memory controller 300 outputs an address ADDR and a data DATA to the memory device 400. The address ADDR represents an address in a cell array 420 where the data DATA is stored.

The memory device 400 includes a cell array 420 and a storage unit 440.

The cell array 420 receives the address ADDR and the data DATA from the memory controller 300. The cell array 420 stores the data DATA at the address ADDR.

The storage unit 440 receives the address ADDR and the data DATA from the memory controller 300. The storage unit 440 stores the address ADDR and the data DATA.

The storage unit 440 stores the address ADDR and the data DATA which violate the write recovery time tWR.

In one example embodiment, the violation determining unit 320 is included in the memory controller 300. When the written data to the storage unit 440 is within the write recovery time tWR of the cell array 420, the violation determining unit 320 determines the written data within the write recovery time tWR as the violation data.

The violation determining unit 320 may count the number of the violation data. The memory controller 300 may output a rewrite command to the memory device 400 when the number of the violation data is equal to or greater than a threshold value.

In one example embodiment, the storage unit 440 stores the data violating the write recovery time tWR and the address of the violation data. When the read command of the address of the violation data is inputted, the data is not outputted from the cell array 420 but from the storage unit 440. Thus, although the cell array 420 of the memory device 400 does not meet the desirable specification of the write recovery time tWR, the memory device 400 may output the adequate data. Therefore, the reliability of the memory device 400 may be improved.

Figure 7:
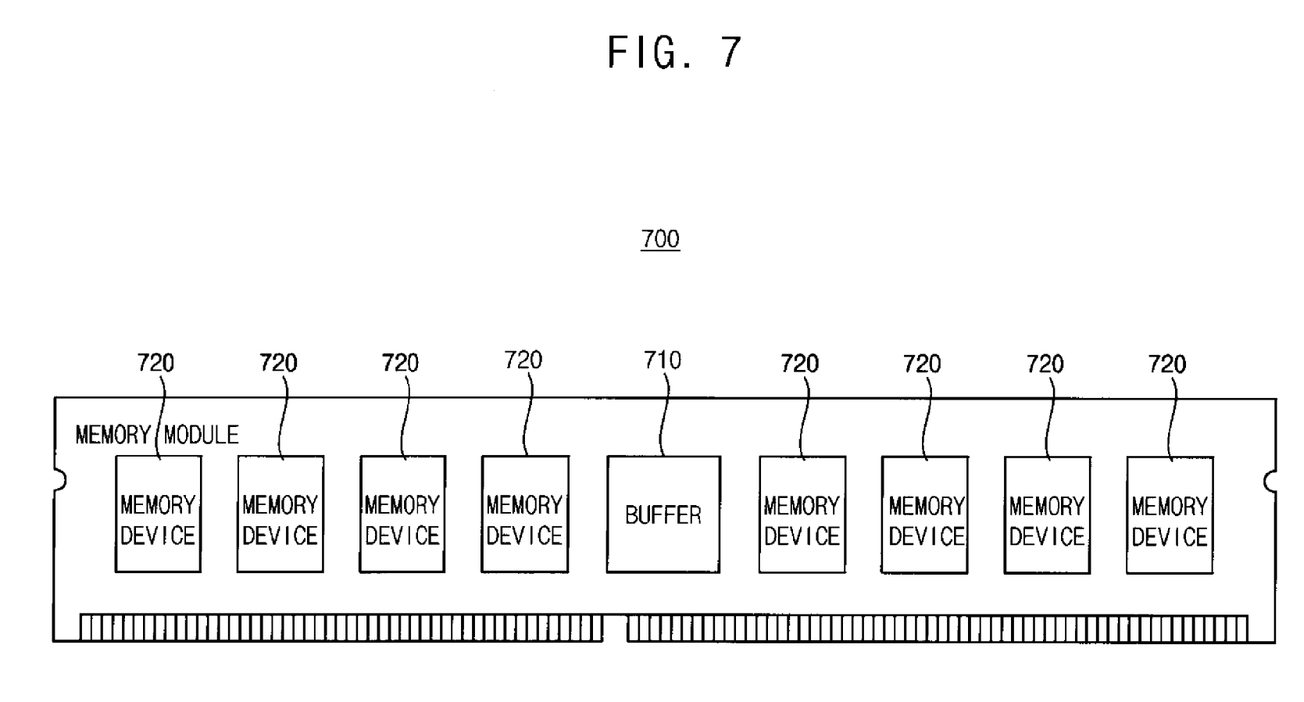
FIG. 7 is a block diagram illustrating a memory module including memory devices, according to an example embodiment of the inventive concepts.

FIG. 7 is a block diagram illustrating a memory module 700 including memory devices 200, according to an example embodiment of the present inventive concepts.

Referring to FIG. 7, a memory module 700 may include a plurality of memory devices 720. In one example embodiment, the memory module 700 may be an unbuffered dual in-line memory module (UDIMM), a registered dual in-line memory module (RDIMM), a fully buffered dual in-line memory module (FBDIMM), a load reduced dual in-line memory module (LRDIMM), etc.

The memory module 700 may further include a buffer 710 which provides a command/address signal and data by buffering the command/address signal and the data from a memory controller through a plurality of transmission lines to the memory devices 720.

In one example embodiment, data transmission lines between the buffer 710 and the memory devices 720 may be coupled in a point-to-point topology, and command/address transmission lines between the buffer 710 and the memory devices 300 may be coupled in a multi-drop topology, a daisy-chain topology, a fly-by daisy-chain topology, etc. Since the buffer 710 buffers, both the command/address signal and the data, the memory controller 100 may interface with the memory module 700 by driving only a load of the buffer 710. Accordingly, the memory module 700 may include more memory devices 720 and/or more memory ranks, and a memory system may include more memory modules.

The memory device 720 includes a cell array writing data and a storage unit. The storage unit stores a data violating the write recovery time and an address of the data violating the write recovery time. When a read command for the data violating the write recovery time is inputted, the data is not read from the cell array but read from the storage unit. When a read command for the data which does not violate the write recovery time, the data is read from the cell array. Thus, although the cell array does not meet the desirable specification of the write recovery time, the memory device may output an accurate data. Therefore, a reliability of the memory device may be improved. In one example embodiment, the memory devices 200 and 400 in FIGS. 1 and 6 may be employed to the memory device 720. The memory devices 200 and 400 in FIGS. 1 and 6 are explained referring to FIGS. 1 to 6 in detail. Therefore, any repetitive explanation concerning the memory device 720 will be omitted.

Figure 8:
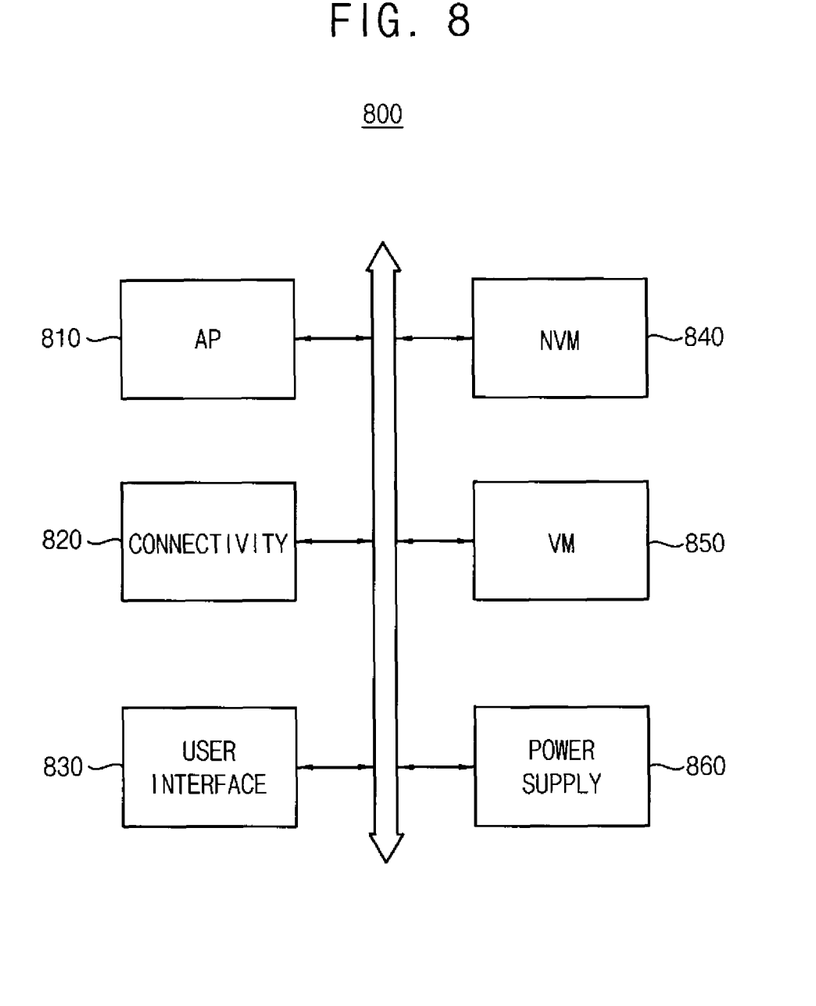
FIG. 8 is a conceptual diagram illustrating a memory system, according to an exemplary embodiment of the inventive concepts applied to a mobile system.

FIG. 8 is a conceptual diagram illustrating a memory system, according to an example embodiment of the inventive concepts applied to a mobile system.

Referring to FIG. 8, a mobile system 800 includes an application processor 810, a connectivity unit 820, a user interface 830, a nonvolatile memory device 840, a volatile memory device 850, and a power supply 860. In some embodiments, the mobile system 800 may be a mobile phone, a smart phone, a personal digital assistant (PDA), a portable multimedia player (PMP), a digital camera, a music player, a portable game console, a navigation system, etc.

The application processor 810 may execute applications, such as a web browser, a game application, a video player, etc. In some embodiments, the application processor 810 may include a single core or multiple cores. For example, the application processor 810 may be a multi-core processor, such as a dual-core processor, a quad-core processor, a hexa-core processor, etc. The application processor 810 may include an internal or external cache memory.

The connectivity unit 820 may perform wired and/or wireless communication with an external device. For example, the connectivity unit 820 may perform Ethernet communication, near field communication (NFC), radio frequency identification (RFID) communication, mobile telecommunication, memory card communication, universal serial bus (USB) communication, etc. In some embodiments, connectivity unit 820 may include a baseband chipset that supports communications, such as global system for mobile communications (GSM), general packet radio service (GPRS), wideband code division multiple access (WCDMA), high speed downlink/uplink packet access (HSxPA), etc.

The volatile memory device 850 may store data processed by the application processor 810, or may operate as a working memory. The volatile memory device 850 may include a cell array for writing data, such as the cell array 220, and a storage unit, such as the storage unit 240. The storage unit stores a data violating the write recovery time and an address of the data violating the write recovery time. When a read command for the data violating the write recovery time is inputted, the data is not read from the cell array but read from the storage unit. When a read command for the data which does not violate the write recovery time, the data is read from the cell array. Thus, although the cell array does not meet the desirable specification of the write recovery time, the memory device may output an accurate data. Therefore, a reliability of the memory device may be improved. In one example embodiment, the memory devices 200 and 400 in FIGS. 1 and 6 may be employed to the volatile memory device 850. The memory devices 200 and 400 in FIGS. 1 and 6 are explained with reference to FIGS. 1-6 in detail. Therefore, any repetitive explanation concerning the volatile memory device 850 will be omitted.

The nonvolatile memory device 840 may store a boot image for booting the mobile system 800. The nonvolatile memory device 840 may be any one of, but not limited to, an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 830 may include at least one input device, such as a keypad, a touch screen, etc., and at least one output device, such as a speaker, a display device, etc. The power supply 860 may supply a voltage to the mobile system 800.

In one example embodiment, the mobile system 800 may further include a camera image processor (CIS), and/or a storage device, such as a memory card, a solid state drive (SSD), a hard disk drive (HDD), a CD-ROM, etc.

In one example embodiment, the mobile system 800 and/or components of the mobile system 800 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), wafer-level processed stack package (WSP), etc.

Figure 9:
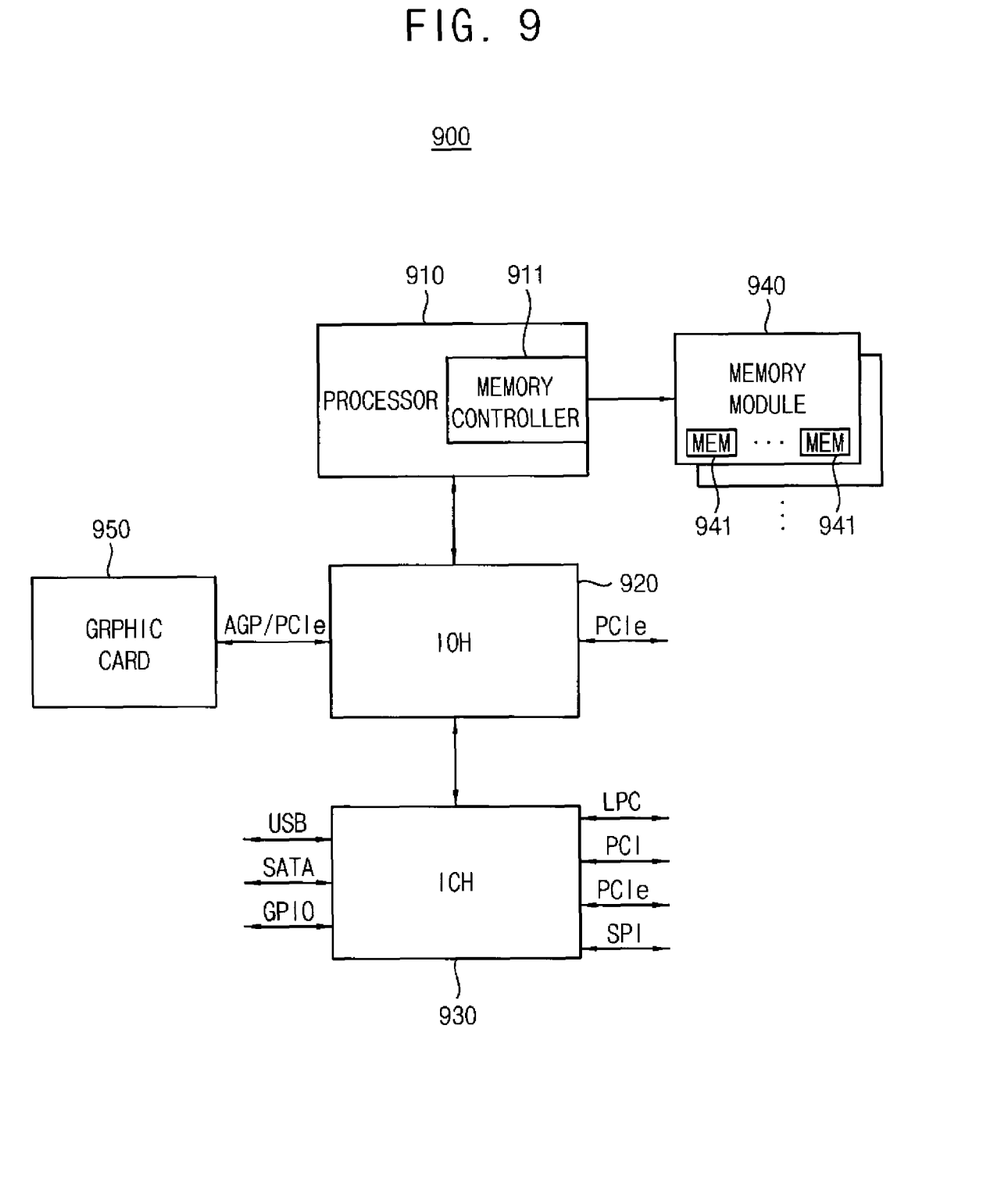
FIG. 9 is a conceptual diagram illustrating a memory system, according to the an example embodiment of the inventive concepts applied to a computing system.

FIG. 9 is a conceptual diagram illustrating a memory system, according to an example embodiment of the inventive concepts applied to a computing system.

Referring to FIG. 9, a computing system 900 includes a processor 910, an input/output hub (IOH) 920, an input/output controller hub (ICH) 930, at least one memory module 940 and a graphics card 950. In one example embodiment, the computing system 900 may be a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, a navigation system, etc.

The processor 910 may perform various computing functions, such as executing specific software for performing specific calculations or tasks. For example, the processor 910 may be a microprocessor, a central process unit (CPU), a digital signal processor, etc. In one example embodiment, the processor 910 may include a single core or multiple cores. For example, the processor 910 may be a multi-core processor, such as a dual-core processor, a quad-core processor, a hexa-core processor, etc. Although FIG. 9 illustrates the computing system 900 including one processor 910, the computing system 900 may include a plurality of processors. The processor 910 may include an internal or external cache memory.

The processor 910 may include a memory controller 911 for controlling operations of the memory module 940. The memory controller 911 included in the processor 910 may be referred to as an integrated memory controller (IMC). A memory interface between the memory controller 911 and the memory module 940 may be implemented with a single channel including a plurality of signal lines, or may be implemented with multiple channels, to each of which at least one memory module 940 may be coupled. In some embodiments, the memory controller 911 may be located inside the input/output hub 920, which may be referred to as memory controller hub (MCH).

The memory module 940 may include a plurality of memory devices (MEM) 941 that store data provided from the memory controller 911. The memory device 941 includes a cell array writing data and a storage unit. The storage unit stores a data violating the write recovery time and an address of the data violating the write recovery time. When a read command for the data violating the write recovery time is inputted, the data is not read from the cell array but read from the storage unit. When a read command for the data which does not violate the write recovery time, the data is read from the cell array. Thus, although the cell array does not meet the desirable specification of the write recovery time, the memory device may output an accurate data. Therefore, a reliability of the memory device may be improved. In one example embodiment, the memory devices 200 and 400 in FIGS. 1 and 6 may be employed to the memory device 941. The memory devices 200 and 400 in FIGS. 1 and 6 are explained with reference to FIGS. 1-6. Therefore, any repetitive explanation concerning the memory device 941 will be omitted.

The input/output hub 920 may manage data transfer between processor 910 and devices, such as the graphics card 950. The input/output hub 920 may be coupled to the processor 910 via various interfaces. For example, the interface between the processor 910 and the input/output hub 920 may be a front side bus (FSB), a system bus, a HyperTransport, a lightning data transport (LDT), a QuickPath interconnect (QPI), a common system interface (CSI), etc. Although FIG. 9 illustrates the computing system 900 including one input/output hub 920, the computing system 900 may include a plurality of input/output hubs. The input/output hub 920 may provide various interfaces with the devices. For example, the input/output hub 920 may provide an accelerated graphics port (AGP) interface, a peripheral component interface-express (PCIe), a communications streaming architecture (CSA) interface, etc.

The graphics card 950 may be coupled to the input/output hub 920 via AGP or PCIe. The graphics card 950 may control a display device (not shown) for displaying an image. The graphics card 950 may include an internal processor for processing image data and an internal memory device. In one example embodiment, the input/output hub 920 may include an internal graphics device along with or instead of the graphics card 950 outside the graphics card 950. The graphics device included in the input/output hub 920 may be referred to as integrated graphics. Further, the input/output hub 920 including the internal memory controller and the internal graphics device may be referred to as a graphics and memory controller hub (GMCH).

The input/output controller hub 930 may perform data buffering and interface arbitration to efficiently operate various system interfaces. The input/output controller hub 930 may be coupled to the input/output hub 920 via an internal bus, such as a direct media interface (DMI), a hub interface, an enterprise Southbridge interface (ESI), PCIe, etc.

The input/output controller hub 930 may provide various interfaces with peripheral devices. For example, the input/output controller hub 930 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In one example embodiment, the processor 910, the input/output hub 920 and the input/output controller hub 930 may be implemented as separate chipsets or separate integrated circuits. In one example embodiment, at least two of the processor 910, the input/output hub 920 and the input/output controller hub 930 may be implemented as a single chipset.

The inventive concepts may be applied to an electronic device including a memory device. For example, the inventive concepts may be applied to a mobile phone, a smart phone, a personal digital assistant (PDA), a portable multimedia player (PMP), a digital camera, a personal computer (PC), a server computer, a workstation, a laptop, a digital television, a set-top box, a music player, a portable game console, a navigation system, etc.

The foregoing is illustrative of example embodiments and is not to be construed as limiting thereof. Although some example embodiments have been described, those skilled in the art will readily appreciate that many modifications to such example embodiments are possible, without materially departing from the inventive concepts. Accordingly, all such modifications are intended to be included within the scope of the inventive concepts.

What is claimed is:
1. A memory device comprising:
a cell array configured to receive data at an associated address in response to a write command;
a storage unit configured to,
  receive the associated address and the data in response to the write command, and
  output the data to the associated address of the cell array in response to a rewrite command; and
a violation determining unit configured to,
  determine data written to the storage unit as violation data if a storage duration of the written data is less than a write recovery time (tWR), and
  count a number of the violation data, the rewrite command being issued based on the number of the violation data.

2. The memory device of claim 1, wherein the violation determining unit is configured to output an alert signal when the number of the violation data is at least equal to a threshold value and greater than the threshold value.

3. The memory device of claim 2, wherein the threshold value is equal to a size of the storage unit.

4. The memory device of claim 1, wherein the storage unit is configured to rewrite all of the violation data to the cell array.

5. The memory device of claim 1, wherein the storage unit is configured to rewrite some of the violation data to the cell array.

6. The memory device of claim 1, wherein
when an address of a read command corresponds to the violation data, the storage unit is configured to output the data stored at the storage unit, and
when the address of the read command does not correspond to the violation data, the cell array is configured to output the data stored at the cell array.

7. The memory device of claim 1, wherein a size of the storage unit is less than a size of the cell array.

8. The memory device of claim 7, wherein the size of the storage unit is determined as a maximum integer less than a value generated by dividing the write recovery time (tWR) of the cell array by a minimum cycle of the write command.

9. The memory device of claim 1, wherein a data writing speed of the storage unit is faster than a data writing speed of the cell array.

10. A memory system comprising:
a memory device including,
    a cell array configured to receive data at an associated address in response to a write command,
    a storage unit configured to,
        receive the associated address and the data in response to the write command, and
        output the data to the associated address of the cell array in response to a rewrite command, and
    a violation determining unit configured to,
        determine data written to the storage unit as violation data if a storage duration of the written data is less than a write recovery time (tWR), and
        count a number of the violation data; and
a memory controller configured to,
    output the write command,
    provide the associated address and the data to the cell array and the storage unit, and
    output the rewrite command to the memory device based on the number of the violation data.

11. The memory system of claim 10, wherein the memory device includes the violation determining unit.

12. The memory system of claim 10, wherein the memory controller includes the violation determining unit.

13. The memory system of claim 10, wherein
when the memory device receives a read command having an address corresponding to the violation data, the memory device is configured to output the data stored at the storage unit, and
when the memory device receives the read command having the address not corresponding to the violation data, the memory device is configured to output the data stored at the cell array.

14. A memory system, comprising:
a memory device having a processor configured to,
    receive at least one of a write command, a rewrite command and a read command from a controller,
    determine if data stored on a memory cell and a storage unit of the memory device is unreliable, upon receiving the at least one of the write command, the rewrite command and the read command, by,
        comparing a storage duration of the data written to the storage unit with a write recovery time of the memory device; and
        determining the written data to be unreliable data if the storing duration is less than the write recovery time, and
    output the data from the storage unit based on the received at least one of the write command, the rewrite command and the read command and upon determining that the data is unreliable.

15. The memory system of claim 14, wherein the cell array is configured to,
receive the data and an associated address at the cell array, in response to the write command; and
store the data at the associated address of the cell array.

16. The memory system of claim 14, wherein the storage unit is configured to,
receive the data and an address at the cell array; and
output the data to the address at the cell array in response to the rewrite command if the memory device determines that the data is unreliable.

17. The memory system of claim 14, wherein the memory device is configured to output the data from the cell array if the processor determines that the data is reliable.

18. The memory system of claim 14, wherein the processor is further configured to,
count a number of data determined to be unreliable, and
provide an alert to the controller if the number exceeds a threshold, wherein
the controller issues the rewrite command upon receiving the alert.

* * * * *